US012620978B2

(12) United States Patent
Weiers

(10) Patent No.: US 12,620,978 B2
(45) Date of Patent: May 5, 2026

(54) USE OF PULSE WIDTH MODULATION TO GENERATE EXCITATION PULSES OFFSET FROM SAMPLING PULSES

(71) Applicant: Microchip Technology Incorporated, Chandler, AZ (US)

(72) Inventor: Stefan Weiers, Heidelberg (DE)

(73) Assignee: Microchip Technology Incorporated, Chandler, AZ (US)

( * ) Notice: Subject to any disclaimer, the term of this patent is extended or adjusted under 35 U.S.C. 154(b) by 42 days.

(21) Appl. No.: 18/799,184

(22) Filed: Aug. 9, 2024

(65) Prior Publication Data

US 2025/0373232 A1     Dec. 4, 2025

Related U.S. Application Data

(60) Provisional application No. 63/652,897, filed on May 29, 2024.

(51) Int. Cl.
*H03K 3/017* (2006.01)
*G01R 31/11* (2006.01)

(52) U.S. Cl.
CPC ............. *H03K 3/017* (2013.01); *G01R 31/11* (2013.01)

(58) Field of Classification Search
CPC ................................. H03K 3/017; G01R 31/11
See application file for complete search history.

(56) References Cited

U.S. PATENT DOCUMENTS

| | | | |
|---|---|---|---|
| 7,071,700 B2 | 7/2006 | Gorka | ........................... 324/534 |
| 2009/0151446 A1* | 6/2009 | Champion | ............ G01F 23/268 |
| | | | 73/291 |
| 2014/0125513 A1 | 5/2014 | Sussman | ........................ 324/124 |
| 2017/0023632 A1* | 1/2017 | Johnson | ................. G01R 31/11 |
| 2020/0116777 A1* | 4/2020 | Cabanillas | ............. G01R 31/08 |
| 2024/0133922 A1 | 4/2024 | Shi et al. | |

FOREIGN PATENT DOCUMENTS

CN          207352114 U      5/2018  ............. G01R 31/11

OTHER PUBLICATIONS

International Search Report and Written Opinion, Application No. PCT/US2024/057220, 12 pages, Feb. 25, 2025.

* cited by examiner

*Primary Examiner* — Sibin Chen
(74) *Attorney, Agent, or Firm* — SLAYDEN GRUBERT BEARD PLLC

(57) ABSTRACT

A system and method for time domain reflectometry (TDR) using fine edge placement pulse width modulation (PWM) is disclosed. The system may include a first pulse width modulation (PWM) circuit. The first PWM circuit may be to generate an excitation pulse and output the excitation pulse to a node of a transmission medium. The system may also include a second PWM circuit. The second PWM circuit may be to generate a sampling pulse and output the sampling pulse a sampling circuit to cause to the sampling circuit to record a signal. The sampling pulse may be offset from the excitation pulse by a time interval. The signal may be indicative of a reflection of the excitation pulse at the node of the transmission medium.

20 Claims, 3 Drawing Sheets

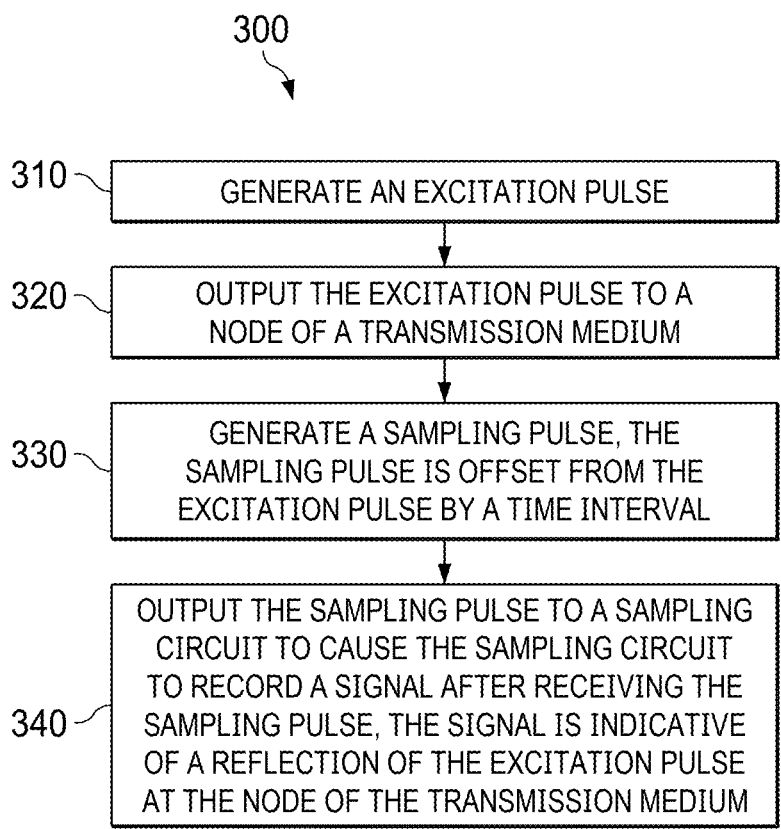

300

310 — GENERATE AN EXCITATION PULSE

320 — OUTPUT THE EXCITATION PULSE TO A NODE OF A TRANSMISSION MEDIUM

330 — GENERATE A SAMPLING PULSE, THE SAMPLING PULSE IS OFFSET FROM THE EXCITATION PULSE BY A TIME INTERVAL

340 — OUTPUT THE SAMPLING PULSE TO A SAMPLING CIRCUIT TO CAUSE THE SAMPLING CIRCUIT TO RECORD A SIGNAL AFTER RECEIVING THE SAMPLING PULSE, THE SIGNAL IS INDICATIVE OF A REFLECTION OF THE EXCITATION PULSE AT THE NODE OF THE TRANSMISSION MEDIUM

FIG. 3

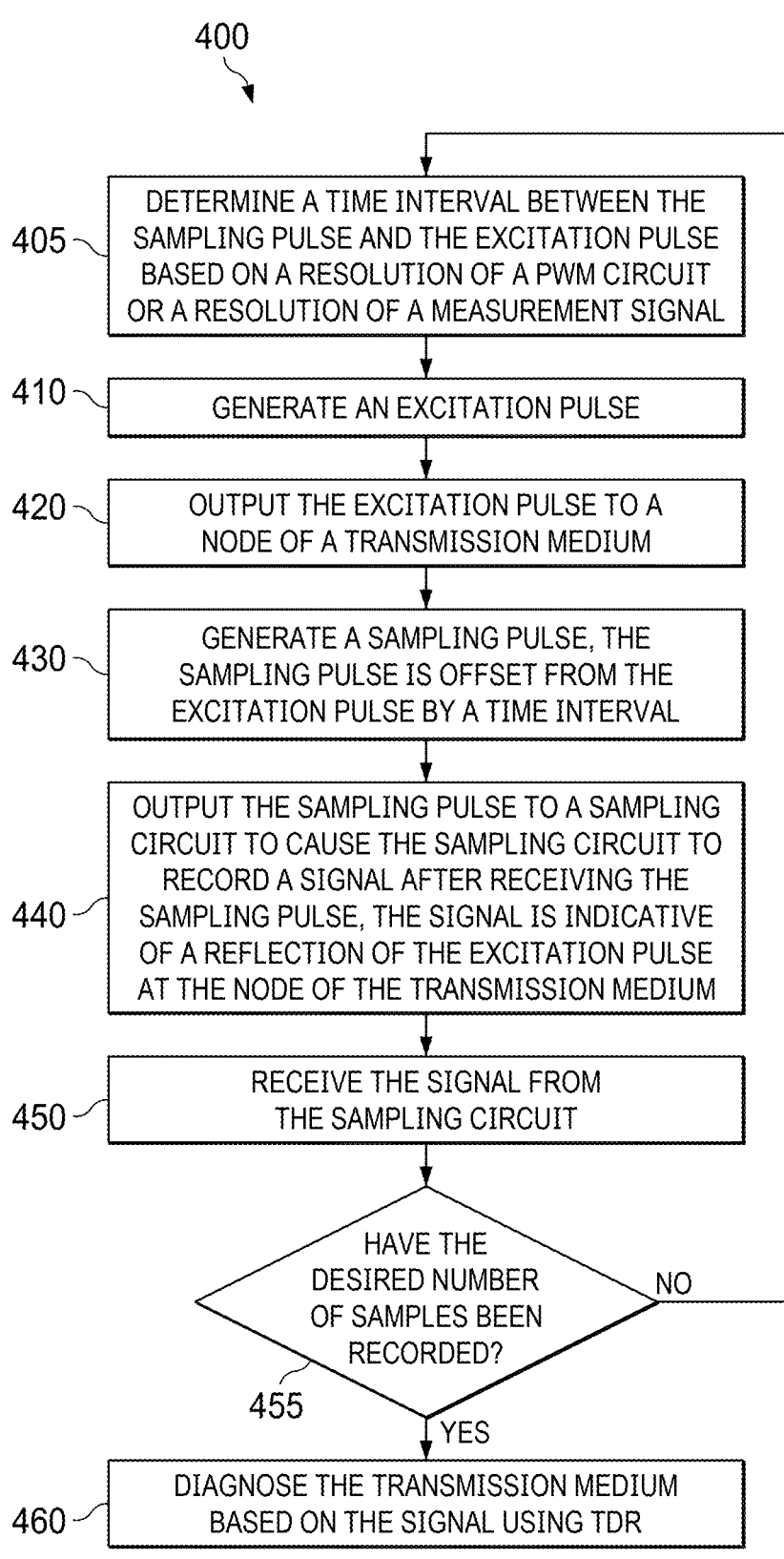

400

405 — DETERMINE A TIME INTERVAL BETWEEN THE SAMPLING PULSE AND THE EXCITATION PULSE BASED ON A RESOLUTION OF A PWM CIRCUIT OR A RESOLUTION OF A MEASUREMENT SIGNAL

410 — GENERATE AN EXCITATION PULSE

420 — OUTPUT THE EXCITATION PULSE TO A NODE OF A TRANSMISSION MEDIUM

430 — GENERATE A SAMPLING PULSE, THE SAMPLING PULSE IS OFFSET FROM THE EXCITATION PULSE BY A TIME INTERVAL

440 — OUTPUT THE SAMPLING PULSE TO A SAMPLING CIRCUIT TO CAUSE THE SAMPLING CIRCUIT TO RECORD A SIGNAL AFTER RECEIVING THE SAMPLING PULSE, THE SIGNAL IS INDICATIVE OF A REFLECTION OF THE EXCITATION PULSE AT THE NODE OF THE TRANSMISSION MEDIUM

450 — RECEIVE THE SIGNAL FROM THE SAMPLING CIRCUIT

455 — HAVE THE DESIRED NUMBER OF SAMPLES BEEN RECORDED?

NO

YES

460 — DIAGNOSE THE TRANSMISSION MEDIUM BASED ON THE SIGNAL USING TDR

FIG. 4

USE OF PULSE WIDTH MODULATION TO GENERATE EXCITATION PULSES OFFSET FROM SAMPLING PULSES

PRIORITY

This application claims priority to U.S. Provisional Patent Application No. 63/652,897 filed May 29, 2024, the contents of which are hereby incorporated in their entirety.

TECHNICAL FIELD

The present disclosure relates generally to data communication networks, and more specifically, to differentiating nodes with identical hardware on a shared bus within a local area network.

BACKGROUND

Time domain reflectometry (TDR) is a technique used to analyze electrical lines by sending a short voltage pulse and examining its reflections. Time-domain reflectometers measure reflections along a conductor by transmitting an incident signal onto the conductor and listening for its reflections. A conductor having uniform impedance, and which is properly terminated will produce no reflections and the incident signal will be absorbed by the termination at the far-end. Reflections in a TDR measurement occur when the pulse encounters a change in the electrical properties of the transmission medium, such as a cable break or a faulty connection. By measuring the time it takes for the reflected pulse to return and considering the propagation speed of the pulse within the transmission medium, a TDR can pinpoint the exact location of the electrical discontinuity. This makes TDR a tool for, for example, troubleshooting and maintaining cables used in telecommunications, data networks, and various electronic systems.

TDR may also be used to differentiate notes with identical hardware in 10Base-T1S systems for automotive and industrial applications. However, TDR implementations are often too complex, expensive, or both to be used for node differentiation due to the high sampling rates and memory transfer speeds used for this application. For example, TDR may use very fast sampling, but may be used to identify conditions on in the transmission medium such as identification of a short core to core, a parallel resistance core to core, an interrupt, or a serial resistance.

Pulse width modulation (PWM) is a technique for controlling analog-like behavior with digital signals. PWM rapidly switches a signal on and off, but by changing the duration of the "on" pulses relative to the "off" periods, PWM creates an average voltage output that can be controlled.

SUMMARY OF THE INVENTION

Aspects provide systems and methods for time domain reflectometry (TDR) using fine edge placement pulse width modulation (PWM). Examples of the present disclosure may include an apparatus. The apparatus may include a first pulse width modulation (PWM) circuit. The first PWM circuit may be to generate an excitation pulse and output the excitation pulse to a node of a transmission medium. The apparatus may also include a second PWM circuit. The second PWM circuit may be to generate a sampling pulse and output the sampling pulse a sampling circuit to cause to the sampling circuit to record a signal. The sampling pulse may be offset from the excitation pulse by a time interval. The signal may be indicative of a reflection of the excitation pulse at the node of the transmission medium.

In combination with any of the above examples, the sampling circuit may be a sample and hold circuit.

In combination with any of the above examples, the apparatus may include an analog-to-digital converter to receive the signal from the sampling circuit.

In combination with any of the above examples, the time interval may be based on a resolution of the first PWM circuit or a resolution of the second PWM circuit.

In combination with any of the above examples, the time interval may be based on a resolution of a measurement signal.

In combination with any of the above examples, the time interval may be equal to one cycle of the first PWM circuit.

Alone or in combination with any of the above examples, examples of the present disclosure may include an apparatus with a sampling circuit to record a signal after receiving a sampling pulse. The signal may be indicative of a reflection of an excitation pulse at a node of a transmission medium. The apparatus may include a pulse width modulation (PWM) circuit. The PWM circuit may be to generate the excitation pulse. The PWM circuit may also be to output the excitation pulse to the node of the transmission medium. The PWM circuit may additionally be to generate the sampling pulse, the sampling pulse is offset from the excitation pulse by a time interval and output the sampling pulse the sampling circuit.

In combination with any of the above examples, the sampling circuit may be a track and hold circuit.

In combination with any of the above examples, the time interval may be based on a resolution of the PWM circuit.

In combination with any of the above examples, the apparatus may include an analog-to-digital converter to receive the signal from the sampling circuit.

In combination with any of the above examples, the time interval may be based on a resolution of a measurement signal.

In combination with any of the above examples, the time interval may be equal to one cycle of the PWM circuit.

Alone or in combination with any of the above examples, examples of the present disclosure may include a method including generating an excitation pulse. The method may also include outputting the excitation pulse to a node of a transmission medium. The method may additionally include generating a sampling pulse. The sampling pulse may be offset from the excitation pulse by a time interval. The method may include outputting the sampling pulse to a sampling circuit to cause the sampling circuit to record a signal after receiving the sampling pulse. The signal may be indicative of a reflection of the excitation pulse at the node of the transmission medium.

In combination with any of the above examples, the method may also include receiving the signal from the sampling circuit.

In combination with any of the above examples, the method may also include diagnosing the transmission medium based on the signal.

In combination with any of the above examples, diagnosing the transmission medium may use time domain reflectometry.

In combination with any of the above examples, the sampling pulse may be generated before a second excitation pulse.

In combination with any of the above examples, the excitation pulse may be generated before the sampling pulse.

In combination with any of the above examples, the time interval may be based on a resolution of a PWM circuit.

In combination with any of the above examples, the time interval may be based on a resolution of a measurement signal.

BRIEF DESCRIPTION OF THE DRAWINGS

The figures illustrate examples of systems and methods.

FIG. 3 illustrates a method performed for TDR using PWM fine-edge placement, according to examples of the present disclosure; and FIG. 4 illustrates a more detailed method performed for TDR using PWM fine-edge placement, according to examples of the present disclosure.

The reference number for any illustrated element that appears in multiple different figures has the same meaning across the multiple figures, and the mention or discussion herein of any illustrated element in the context of any particular figure also applies to each other figure, if any, in which that same illustrated element is shown.

DESCRIPTION

According to an aspect of the invention, a system and method for time domain reflectometry (TDR) using fine edge placement pulse width modulation (PWM) is provided. The disclosed system and method may use PWM capability in a digital signal controller to perform TDR sampling at a high effective sampling rate while using no, or few, external active parts on the signal path, such as high-speed analog-to-digital converters (ADC) and memory or other specialized or expensive components. In some examples, the sampling rate may be approximately 4 gigasamples (Gs) per second. The sampling rate of 4 Gs/s may correspond to a length resolution of approximately one inch on a standard twisted pair cable. The disclosed system and method may be a cost-effective TDR solution with a cable length resolution better than 10 centimeters (~4 inches). The disclosed system and method may be used for a variety of applications including, but not limited to, localization and identification of 10BASE-T1S nodes, level sensing, cable testing, distance measurement, soil analysis, and moisture monitoring.

Fine edge placement PWM may provide more precise control over the timing of the pulse edges than standard PWM. For example, in standard PWM, the duty cycle (percentage of "on" time) is controlled by varying the width of the pulse within a fixed period. The leading and trailing edges of the pulse may not be precisely controlled, potentially causing inconsistencies in the output signal, especially at lower frequencies. In contrast, fine edge placement PWM may allow for independent control of both the leading and trailing edges of the pulse. Therefore, the PWM signal can define not just the "on" time but also the exact moment the pulse starts and ends within the period.

Figure 1:
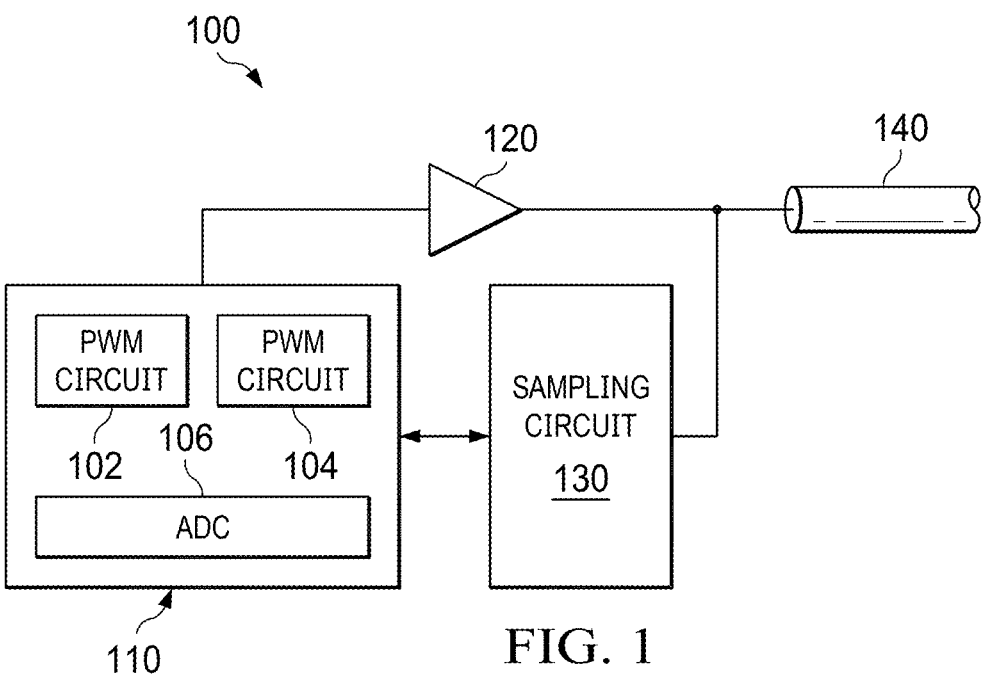
FIG. 1 illustrates an implementation of TDR using PWM fine-edge placement and an external sampling circuit, according to examples of the present disclosure.

FIG. 1 illustrates an implementation of TDR using PWM fine-edge placement and an external sampling circuit, according to examples of the present disclosure. System 100 may include control circuit 110, driver 120, and sampling circuit 130.

Control circuit 110 may be a central processing unit (CPU), a general purpose processor, a specific purpose processor, a microcontroller, a programmable logic controller (PLC), a digital signal processor (DSP), an application specific integrated circuit (ASIC), a field-programmable gate array (FPGA), or other programmable logic device, discrete gate or transistor logic, discrete hardware components, other programmable device, or any combination thereof designed to perform the functions disclosed herein. Control circuit 110 may include PWM circuits 102 and 104 and analog-to-digital converter 106.

PWM circuit 102 may generate an excitation pulse using fine edge placement PWM and may provide the excitation pulse to driver 120. Driver 120 may then, in response to the excitation pulse, generate a voltage pulse and communicate the voltage pulse to transmission medium 140. Transmission medium 140 may be any suitable medium for performing TDR, such as a cable, a pipeline, an electrical line, soil, liquid, or other solid.

Sampling circuit 130 may capture the reflections of the voltage pulse generated by driver 120 and sent through transmission medium 140. Sampling circuit 130 may be a sample and hold circuit, a track and hold circuit, or any other circuit suitable for capturing the reflections of the voltage pulse. Sampling circuit 130 may capture the reflections at the same node at which driver 120 generates the voltage pulse. Sampling circuit 130 may provide an output indicating the captured reflections to analog-to-digital converter 106 in control circuit 110.

Sampling circuit 130 may receive a sampling pulse from PWM circuit 104 in control circuit 110. The sampling pulse may trigger sampling circuit 130 to capture the reflections. In some examples, PWM circuit 104 that generates the sampling pulse may be separate from PWM circuit 102 that generates the excitation pulse provided to driver 120. In other examples, PWM circuit 104 and PWM circuit 102 may be combined into a single PWM circuit.

The excitation pulse and the sampling pulse may be offset from one another by a time interval. For example, the excitation pulse may be generated at time to and the sampling pulse may be generated at time $t_1$, where the difference between time $t_1$ and time to is the time interval. The time interval may depend on the time range in which reflections are to be expected (referred to as the "time range of interest"). The time range of interest may depend on the length of transmission medium 140, the propagation speed of the excitation pulse, or both. The time interval may be adjusted in small steps to cover a time range of interest while sampling circuit 130 is capturing reflections. The step size of the adjustment to the time interval may be determined by, for example, the resolution of the measurement signal or the capabilities of PWM circuit 102 and PWM circuit 104. A smaller step size may have greater resolution than a larger step size. The minimum step size may be the resolution of PWM circuit 102 and PWM circuit 104.

Instead of measuring and capturing reflections at a high sample rate (e.g., several gigasamples per second), sampling circuit 130 may acquire each data point as a separate measurement based on the expected time at which a reflection may occur, thus potentially reducing the use of additional equipment. The input signal to the analog-to-digital converter in control circuit 110 may remain constant during the sampling such that the sampling is independent of the ADC clock time frame.

Figure 2:
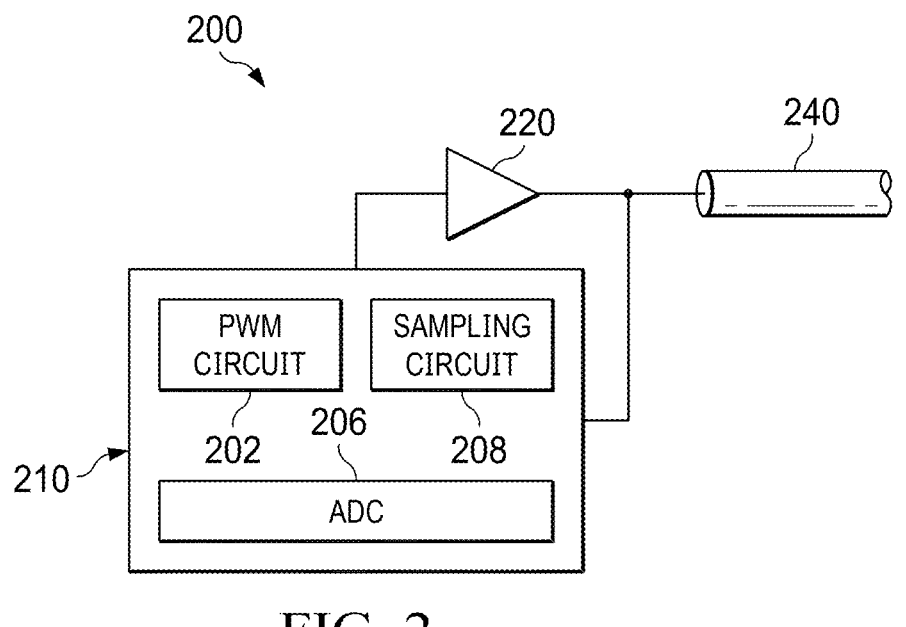
FIG. 2 illustrates an implementation of TDR using PWM fine-edge placement and an internal sampling circuit, according to examples of the present disclosure.

FIG. 2 illustrates an implementation of TDR using PWM fine-edge placement and an internal sampling circuit, according to examples of the present disclosure. System 200 may include control circuit 210 and driver 120.

Control circuit 210 may be similar to control circuit 110 and may be CPU, a general purpose processor, a specific purpose processor, a microcontroller, a PLC, a DSP, an ASIC, an FPGA, or other programmable logic device, discrete gate or transistor logic, discrete hardware components, other programmable device, or any combination thereof designed to perform the functions disclosed herein. Control circuit 210 may include PWM circuit 202, analog-to-digital converter 206 and sampling circuit 208.

PWM circuit 202 may be similar to PWM circuit 102 and may generate an excitation pulse using fine edge placement PWM and may provide the excitation pulse to driver 220. Driver 220 may then, in response to the excitation pulse, generate a voltage pulse and communicate the voltage pulse to transmission medium 240. Transmission medium 240 may be any suitable medium for performing TDR, such as a cable, a pipeline, an electrical line, soil, liquid, or other solid.

Sampling circuit 208 may capture the reflections of the voltage pulse generated by driver 220 and sent through transmission medium 240. Sampling circuit 208 may be a sample and hold circuit, a track and hold circuit, or any other circuit suitable for capturing the reflections of the voltage pulse. Sampling circuit 208 may capture the reflections at the same node at which driver 220 generates the voltage pulse. Sampling circuit 208 may provide an output indicating the captured reflections to analog-to-digital converter 206 in control circuit 210.

Sampling circuit 208 may receive a sampling pulse from PWM circuit 202 in control circuit 210. The sampling pulse may trigger sampling circuit 208 to capture the reflections. The excitation pulse and the sampling pulse may be offset from one another by a time interval. For example, the sampling pulse may be generated at time to and the excitation pulse may be generated at time $t_1$, where the difference between time $t_1$ and time to is the time interval. As an example, the time interval may be adjusted in small steps to cover a time range of interest while sampling circuit 208 is capturing reflections. The step size of the adjustment to the time interval may be determined by, for example, the resolution of the measurement signal or the capabilities of PWM circuit 202. As another example, the time interval may be based on the duty cycle of PWM circuit 202 (e.g., approximately equal to one cycle of PWM circuit 202).

In the example shown in FIG. 2, the excitation pulse may be shifted in small steps while the time of the sampling pulse remains constant.

Instead of measuring and capturing reflections at a high sample rate (e.g., several gigasamples per second), sampling circuit 208 may acquire each data point as a separate measurement based on the expected time at which a reflection may occur, thus potentially reducing the use of additional equipment. The input signal to the analog-to-digital converter 106 in control circuit 210 may remain constant during the sampling such that the sampling is independent of the ADC clock time frame.

FIG. 3 illustrates a method performed for TDR using PWM fine-edge placement, according to examples of the present disclosure. Method 300 may be implemented using a control circuit, such as control circuit 110 or control circuit 210 shown in FIGS. 1 and 2, respectively, in combination with a processor, or any other system operable to implement method 300. Although examples have been described above, other variations and examples may be made from this disclosure without departing from the spirit and scope of these disclosed examples.

Method 300 may begin at block 310 where the control circuit may generate an excitation pulse. The control circuit may generate the excitation pulse using a PWM circuit to generate the pulse using fine edge placement.

At block 320, the control circuit may output the excitation pulse to a node of a transmission medium. The control circuit may first output the excitation pulse to a driver, such as driver 120 or 220 shown in FIGS. 1 and 2, respectively. The driver may then, in response to the excitation pulse, generate a voltage pulse and communicate the voltage pulse to the transmission medium.

At block 330, the control circuit may generate a sampling pulse. The sampling pulse may be generated by a PWM circuit in the control circuit using fine edge placement PWM. The sampling pulse may be offset from the excitation pulse by a time interval. For example, the sampling pulse may be generated at time to and the excitation pulse may be generated at time $t_1$, where the difference between time $t_1$ and time $t_0$ is the time interval. The time interval may be adjusted in small steps to cover a time range of interest while the sampling circuit is capturing reflections. The step size of the adjustment to the time interval may be determined by, for example, the resolution of the measurement signal or the capabilities of the PWM circuit.

At block 340, the control circuit may output the sampling pulse to a sampling circuit to cause the sampling circuit, such as sampling circuit 130 or 208 shown in FIGS. 1 and 2, respectively, to record a signal after receiving the sampling pulse. The signal may be indicative of a reflection of the excitation pulse at the node of the transmission medium.

Method 300 may be repeated multiple times until a desired number of signals are recorded to allow for analysis of the signals.

Although FIG. 3 discloses a particular number of operations related to method 300, method 300 may be executed with greater or fewer operations than those depicted in FIG. 3. In addition, although FIG. 3 discloses a certain order of operations to be taken with respect to method 300, the operations comprising method 300 may be completed in any suitable order.

FIG. 4 illustrates a more detailed method performed for TDR using PWM fine-edge placement, according to examples of the present disclosure. Method 400 may be implemented using a control circuit, such as control circuit 110 or control circuit 210 shown in FIGS. 1 and 2, respectively, in combination with a processor, or any other system operable to implement method 400. Although examples have been described above, other variations and examples may be made from this disclosure without departing from the spirit and scope of these disclosed examples.

Method 400 may begin at block 405 where the control circuit may determine a time interval between a sampling pulse and the excitation pulse. For example, the sampling pulse may be generated at time to and the excitation pulse may be generated at time $t_1$, where the difference between time $t_1$ and time $t_0$ is the time interval. In some examples, the time interval may be adjusted in small steps to cover a time range of interest while the sampling circuit is capturing reflections. The step size of the adjustment to the time interval may be determined by, for example, the resolution of the measurement signal or the capabilities of the PWM circuit. In other examples, the time interval may be based on a resolution of the PWM circuit. Such a time interval may avoid introducing requirements to the timing of an analog-to-digital circuit in the control circuit or the sampling circuit.

At block 410, the control circuit may generate an excitation pulse. The control circuit may generate the excitation pulse using a PWM circuit to generate the pulse using fine edge placement.

At block 420, the control circuit may output the excitation pulse generated at block 410 to a node of a transmission medium. The control circuit may first output the excitation pulse to a driver, such as driver 120 or 220 shown in FIGS. 1 and 2, respectively. The driver may then, in response to the excitation pulse, generate a voltage pulse and communicate the voltage pulse to the transmission medium.

At block 430, the control circuit may generate the sampling pulse. The sampling pulse may be generated by a PWM circuit in the control circuit using fine edge placement PWM. The sampling pulse may be offset from the excitation pulse by the time interval determined at block 405.

At block 440, the control circuit may output the sampling pulse to a sampling circuit to cause the sampling circuit, such as sampling circuit 130 or 208 shown in FIGS. 1 and 2, respectively, to record a signal after receiving the sampling pulse. The signal may be indicative of a reflection of the excitation pulse at the node of the transmission medium.

At block 450, the control circuit may receive the signal from the sampling circuit. The signal may be received at an analog-to-digital converter, such as analog-to-digital converter 106 or 206 shown in FIGS. 1 and 2, respectively.

At block 455, the control circuit may determine whether the desired number of samples have been recorded. The desired number of samples may be based on the number of samples used in the analysis to be performed at block 460.

At block 460, the control circuit may diagnose the transmission medium based on the signal using TDR techniques. For example, the length of a cable may be determined using TDR techniques by measuring the time between transmitting a signal and receiving a reflected signal. As another example, TDR techniques may identify and locate faults in a cable by analyzing the signals indicative of the reflections. As a further example, TDR techniques may be used to measure the impedance of the transmission medium. As yet another example, TDR techniques may be used to measure the level of a liquid in a container.

Although FIG. 4 discloses a particular number of operations related to method 400, method 400 may be executed with greater or fewer operations than those depicted in FIG. 4. In addition, although FIG. 4 discloses a certain order of operations to be taken with respect to method 400, the operations comprising method 400 may be completed in any suitable order.

By using the fine-edge placement of PWM circuits in a control circuit, the disclosed system and method may achieve an effective ADC sampling rate on the order of magnitude of the PWM resolution with periodic measurement. The disclosed systems and methods may shift the excitation pulse instead of the sample time to achieve similar results without an external fast sampling circuit. The disclosed system and method may enable the use of a control circuit for TDR applications without using specialized or cost-intensive external components.

Although examples have been described above, other variations and examples may be made from this disclosure without departing from the spirit and scope of these disclosed examples.

The invention claimed is:

1. An apparatus, comprising:
a first pulse width modulation (PWM) circuit to:

generate an excitation pulse; and
output the excitation pulse to a driver to cause the driver to generate a voltage pulse and communicate the voltage pulse to a node of a transmission medium; and
a second PWM circuit to:
generate a sampling pulse, the sampling pulse is offset from the excitation pulse by a time interval, the time interval based on an expected time a reflection of the excitation pulse is to be received at the node; and
output the sampling pulse to a sampling circuit to cause the sampling circuit to record a signal, the signal is indicative of the reflection of the excitation pulse at the node of the transmission medium.

2. The apparatus of claim 1, wherein the sampling circuit is a sample and hold circuit.

3. The apparatus of claim 1, comprising an analog-to-digital converter to receive the signal from the sampling circuit.

4. The apparatus of claim 1, wherein the time interval is based on a resolution of the first PWM circuit or a resolution of the second PWM circuit.

5. The apparatus of claim 1, wherein the time interval is based on a resolution of a measurement signal.

6. The apparatus of claim 1, wherein the time interval is equal to one cycle of the first PWM circuit.

7. An apparatus, comprising:
a sampling circuit to record a signal after receiving a sampling pulse, the signal is indicative of a reflection of an excitation pulse at a node of a transmission medium; and
a pulse width modulation (PWM) circuit to:
generate the excitation pulse;
output the excitation pulse to a driver to cause the driver to generate a voltage pulse and communicate the voltage pulse to the node of the transmission medium;
generate the sampling pulse, the sampling pulse is offset from the excitation pulse by a time interval, the time interval based on an expected time the reflection of the excitation pulse is to be received at the node; and
output the sampling pulse to the sampling circuit.

8. The apparatus of claim 7, wherein the sampling circuit is a track and hold circuit.

9. The apparatus of claim 7, wherein the time interval is based on a resolution of the PWM circuit.

10. The apparatus of claim 7, comprising an analog-to-digital converter to receive the signal from the sampling circuit.

11. The apparatus of claim 7, wherein the time interval is based on a resolution of a measurement signal.

12. The apparatus of claim 7, wherein the time interval is equal to one cycle of the PWM circuit.

13. A method, comprising:
generating an excitation pulse;
outputting the excitation pulse to a driver to cause the driver to generate a voltage pulse and communicate the voltage pulse to a node of a transmission medium;
generating a sampling pulse, the sampling pulse is offset from the excitation pulse by a time interval, the time interval based on an expected time a reflection of the excitation pulse is to be received at the node; and
outputting the sampling pulse to a sampling circuit to cause the sampling circuit to record a signal after receiving the sampling pulse, the signal is indicative of the reflection of the excitation pulse at the node of the transmission medium.

14. The method of claim 13, comprising receiving the signal from the sampling circuit.

15. The method of claim 14, comprising diagnosing the transmission medium based on the signal.

16. The method of claim 15, wherein diagnosing the transmission medium uses time domain reflectometry.

17. The method of claim 13, wherein the sampling pulse is generated before a second excitation pulse.

18. The method of claim 13, wherein the excitation pulse is generated before the sampling pulse.

19. The method of claim 13, wherein the time interval is based on a resolution of a PWM circuit.

20. The method of claim 13, wherein the time interval is based on a resolution of a measurement signal.

* * * * *